US009824824B2

(12) United States Patent
Park

(10) Patent No.: US 9,824,824 B2
(45) Date of Patent: Nov. 21, 2017

(54) COIL ELECTRONIC COMPONENT AND METHOD OF MANUFACTURING THE SAME

(71) Applicant: SAMSUNG ELECTRO-MECHANICS CO., LTD., Suwon-si, Gyeonggi-do (KR)

(72) Inventor: Heung Kil Park, Suwon-si (KR)

(73) Assignee: SAMSUNG ELECTRO-MECHANICS CO., LTD., Suwon-si, Gyeonggi-do (KR)

(*) Notice: Subject to any disclaimer, the term of this patent is extended or adjusted under 35 U.S.C. 154(b) by 2 days.

(21) Appl. No.: 14/992,904

(22) Filed: Jan. 11, 2016

(65) Prior Publication Data

US 2016/0309578 A1     Oct. 20, 2016

(30) Foreign Application Priority Data

Apr. 20, 2015  (KR) .................... 10-2015-0055397

(51) Int. Cl.
*H05K 1/02*  (2006.01)
*H05K 1/18*  (2006.01)
(Continued)

(52) U.S. Cl.
CPC .............. *H01G 4/248* (2013.01); *H01G 2/06* (2013.01); *H01G 4/232* (2013.01); *H01G 4/30* (2013.01); *H01G 4/38* (2013.01); *H01L 41/053* (2013.01); *H01G 4/012* (2013.01); *H01L 41/083* (2013.01); *H05K 1/0306* (2013.01); *H05K 1/141* (2013.01);
(Continued)

(58) Field of Classification Search
CPC ... H01G 4/30; H01G 4/28; H05K 2201/10015
See application file for complete search history.

(56) References Cited

U.S. PATENT DOCUMENTS 6,369,335 B1 * 4/2002 Wajima ............. H01L 23/49805
174/261
2006/0198079 A1   9/2006 Shim et al.
(Continued)

FOREIGN PATENT DOCUMENTS

JP      2000-182888 A      6/2000
JP       2000182888 A  *   6/2000
(Continued)

OTHER PUBLICATIONS

Korean Office Action issued in Application No. 10-2015-0055397 dated Apr. 18, 2016, with English translation.

*Primary Examiner* — Hoa C Nguyen
*Assistant Examiner* — Amol Patel
(74) *Attorney, Agent, or Firm* — McDermott Will & Emery LLP

(57) ABSTRACT

A capacitor component includes a capacitor including a plurality of internal electrodes, a capacitor body containing a piezoelectric material disposed in at least regions between the plurality of internal electrodes, and external electrodes connected to the plurality of internal electrodes; and an interposer disposed to be coupled to the capacitor and including a buffer substrate containing a buffer material having a degree of piezoelectricity lower than that of the piezoelectric material, and connection electrodes electrically connected to the external electrodes.

17 Claims, 6 Drawing Sheets

(51) Int. Cl.
*H01G 4/30* (2006.01)
*H01G 4/248* (2006.01)
*H01G 4/12* (2006.01)
*H01G 4/012* (2006.01)
*H01G 4/38* (2006.01)
*H01G 2/06* (2006.01)
*H01G 4/232* (2006.01)
*H01L 41/053* (2006.01)
*H05K 1/03* (2006.01)
*H05K 1/14* (2006.01)
*H01L 41/083* (2006.01)

(52) U.S. Cl.
CPC .............. *H05K 2201/10015* (2013.01); *H05K 2201/1053* (2013.01); *H05K 2201/10378* (2013.01); *H05K 2201/10962* (2013.01)

(56) References Cited

U.S. PATENT DOCUMENTS

| | | | |
|---|---|---|---|
| 2008/0186652 A1* | 8/2008 | Lee | H01G 4/012 361/306.3 |
| 2013/0037911 A1 | 2/2013 | Hattori et al. | |
| 2013/0319741 A1 | 12/2013 | Ahn et al. | |
| 2014/0016242 A1 | 1/2014 | Hattori et al. | |
| 2014/0268487 A1 | 9/2014 | Yoshida | |
| 2014/0284089 A1* | 9/2014 | Hattori | H05K 1/141 174/258 |
| 2015/0221441 A1* | 8/2015 | Katsuyama | H01G 4/30 361/301.4 |
| 2015/0221571 A1* | 8/2015 | Chaparala | H01L 23/15 438/125 |
| 2015/0270068 A1* | 9/2015 | Hattori | H01G 4/30 361/301.4 |
| 2016/0007446 A1* | 1/2016 | Ishikawa | H05K 1/113 174/260 |

FOREIGN PATENT DOCUMENTS

| | | |
|---|---|---|
| JP | 2012-204572 A | 10/2012 |
| JP | 2014-179512 A | 9/2014 |
| JP | 2014-179583 A | 9/2014 |
| KR | 10-2005-0093878 A | 9/2005 |
| KR | 10-2006-0098771 A | 9/2006 |
| KR | 10-2013-0018146 A | 2/2013 |
| KR | 10-2013-0040423 A | 4/2013 |
| KR | 10-1309479 B1 | 9/2013 |
| KR | 10-2014-0038876 A | 3/2014 |

* cited by examiner

COIL ELECTRONIC COMPONENT AND METHOD OF MANUFACTURING THE SAME

CROSS-REFERENCE TO RELATED APPLICATIONS

This application claims the benefit of priority to Korean Patent Application No. 10-2015-0055397, filed on Apr. 20, 2015 with the Korean Intellectual Property Office, the entirety of which is incorporated herein by reference.

TECHNICAL FIELD

The present inventive concept relates to a capacitor component.

BACKGROUND

Examples of electronic components using a ceramic material include capacitors, inductors, piezoelectric elements, varistors, thermistors, and the like.

Among ceramic electronic components, multilayer ceramic capacitors (MLCC) may be used in various electronic devices, due to advantages such as compact size, high capacitance, ease of mounting, and the like.

For example, a multilayer ceramic capacitor may be used in a chip type condenser mounted on a printed circuit board of several electronic products such as imaging devices, for example, liquid crystal displays (LCDs) or plasma display panels (PDPs), computers, personal digital assistants (PDAs), and mobile phones, to serve to charge or discharge electricity therein or therefrom.

The multilayer ceramic capacitor may have a structure in which a plurality of dielectric layers and internal electrodes disposed between the dielectric layers and having different polarities are alternately stacked.

Since the dielectric layers may be composed of a piezoelectric material, when a direct current (DC) or alternate current (AC) voltage is applied to the multilayer ceramic capacitor, a piezoelectric phenomenon may be generated between the internal electrodes, causing periodic vibrations when the volume of the ceramic body is expanded and contracted according to a frequency.

The vibrations may be transferred to a printed circuit board through an external electrode of the multilayer ceramic capacitor and a soldering material connecting the external electrode to the printed circuit board, and thus, the entire printed circuit board may become an acoustic reflective surface to generate the vibrated sound, which is observed as noise. This vibrated sound may have a frequency corresponding to an audio frequency in a region of 20 to 20, 000 Hz, which may cause listener discomfort and is referred to as acoustic noise.

Furthermore, in recent electronic devices, since an attempt to reduce the noise of equipment components has been ongoing, acoustic noise generated in the multilayer ceramic capacitor as described above may become more prominent.

In a case in which the operating environments of equipment are silent, the user regards acoustic noise as an abnormal sound, and thus may interpret the disorder of acoustic noises as the breakdown of equipment. In addition, in devices having a voice circuit, acoustic noise may overlap with audio output, thereby leading to deterioration in the quality of the device.

SUMMARY

An aspect of the present inventive concept provides a capacitor component in which acoustic noise may be reduced when being mounted on a printed circuit board or the like.

According to an aspect of the present inventive concept, a capacitor component comprises a capacitor including a plurality of internal electrodes, a capacitor body containing a piezoelectric material disposed at least in regions between the plurality of internal electrodes, and external electrodes connected to the plurality of internal electrodes; and an interposer disposed to be coupled to the capacitor and including a buffer substrate containing a buffer material having a degree of piezoelectricity lower than that of the piezoelectric material, and connection electrodes electrically connected to the external electrodes.

The capacitor component may further comprise an electrode sheet disposed on an opposite side of the interposer from the capacitor and coupled to the interposer, and including a sheet portion and an electrode portion disposed on the sheet portion.

The capacitor component may further comprise a molding part encapsulating the capacitor, the interposer, and the electrode sheet while outwardly exposing a portion of the electrode sheet.

The capacitor component may further comprise a molding part encapsulating the capacitor and the interposer while outwardly exposing a portion of the interposer.

The capacitor component may further comprise a conductive adhesive disposed between the capacitor and the interposer.

The plurality of internal electrodes may be disposed orthogonally with respect to the interposer.

The plurality of internal electrodes may be disposed in parallel with respect to the interposer.

The external electrodes may include first and second external electrodes, and the plurality of internal electrodes may include first and second internal electrodes connected to the first and second external electrodes, respectively.

The external electrodes may include two first external electrodes and a single second external electrode, and the plurality of internal electrodes may include first internal electrodes connected to the two first external electrodes and second internal electrodes connected to the second external electrode.

The first and second internal electrodes may respectively include lead portions to be connected to the first and second external electrodes.

Each of the capacitor and the interposer coupled to the capacitor may be provided in plural, and the plurality of capacitors and interposers may be disposed in an array form in such a manner that they form at least one row or column.

The external electrodes may comprise at least two first external electrodes and a second external electrode, and the connection electrodes may comprise at least two first connection electrodes and a second connection electrode, the first external electrodes being connected to the first connection electrodes and the second external electrode being connected to the second connection electrode.

At least one of the connection electrodes may penetrate the interposer.

According to another aspect of the present inventive concept, a capacitor component comprises a capacitor comprising a piezoelectric material and external electrodes; an interposer comprising a buffer substrate having a lower degree of piezoelectricity than the piezoelectric material and connection electrodes, the connection electrodes being coupled to the external electrodes on a first surface of the interposer; an electrode sheet comprising electrode portions coupled to the connection electrodes on a second surface of the interposer opposite to the first surface of the interposer; and a molding portion encapsulating the capacitor, the interposer and the electrode sheet while outwardly exposing portions of a surface of the electrode sheet.

According to another aspect of the present inventive concept, a capacitor component comprises a plurality of capacitors each comprising a piezoelectric material and external electrodes; a plurality of interposers each comprising a buffer substrate having a lower degree of piezoelectricity than the piezoelectric material and connection electrodes, each interposer disposed to be coupled to one among the plurality of capacitors, wherein the connection electrodes of each interposer are coupled to the external electrodes of the coupled capacitor on a first surface of the interposer; an electrode sheet comprising electrode portions coupled to the connection electrodes on a second surface of each of the plurality of interposers opposite to the first surface of each of the plurality of interposers; and a molding portion encapsulating the plurality of capacitors, the plurality of interposers and the electrode sheet while outwardly exposing portions of a surface of the electrode sheet.

The plurality of capacitors and interposers may be arranged to form a row in a width direction of the capacitor component or in a width direction of the capacitor component.

BRIEF DESCRIPTION OF THE DRAWINGS

The above and other aspects, features, and advantages of the present inventive concept will be more clearly understood from the following detailed description taken in conjunction with the accompanying drawings, in which.

DETAILED DESCRIPTION

Figure 1:
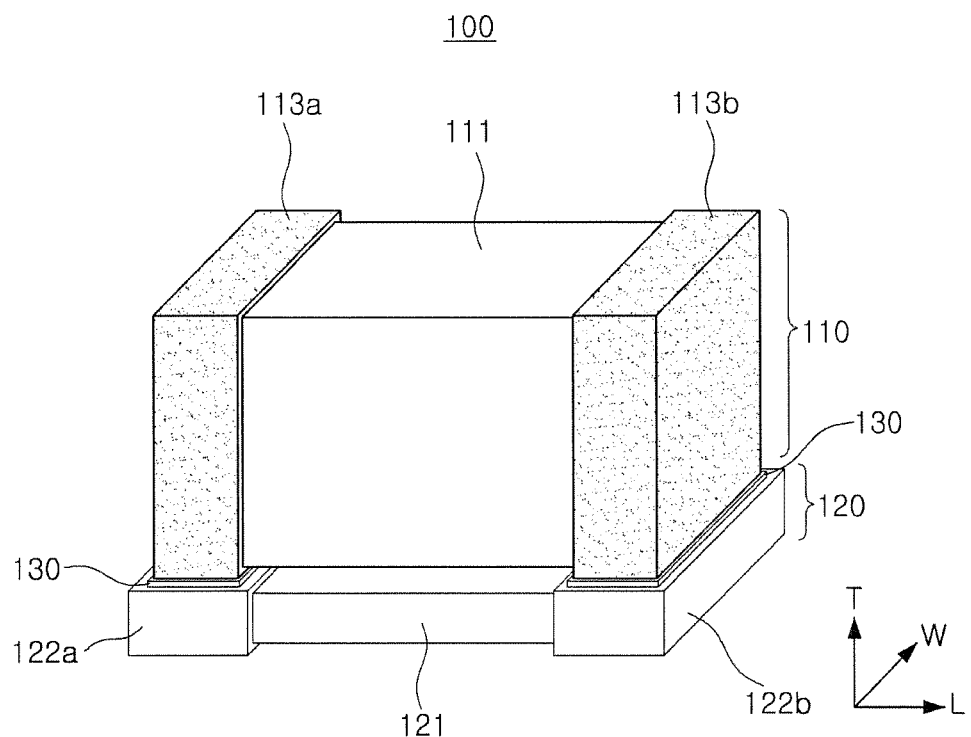
FIG. 1 and FIG. 2 are a perspective view and a cross-sectional view of a capacitor component according to an exemplary embodiment of the present inventive concept.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "upper," or "above" other elements would then be oriented "lower" or "below" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

The contents of the present inventive concept described below may have a variety of configurations and propose only a required configuration herein, but are not limited thereto.

Figure 2:
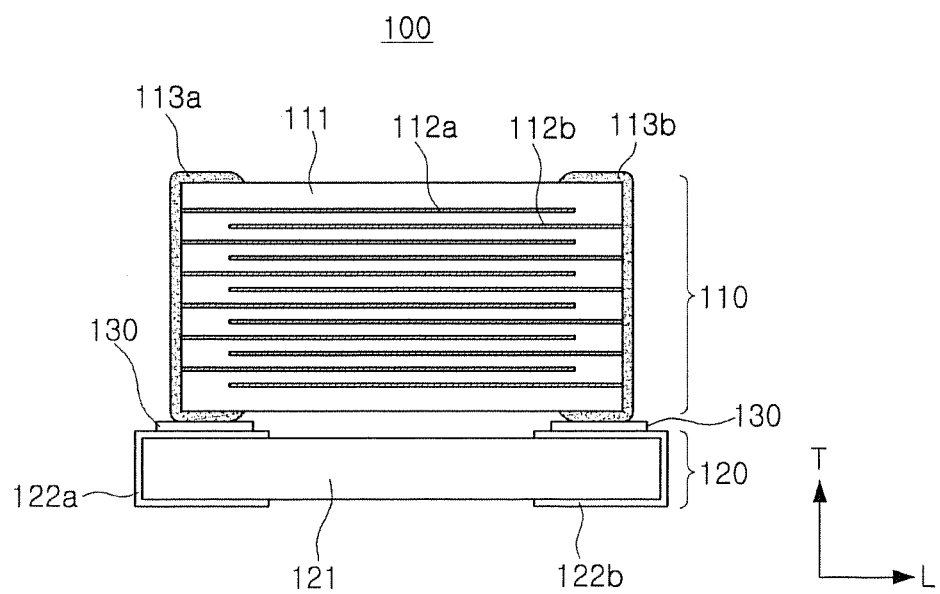

FIG. 1 and FIG. 2 are a perspective view and a cross-sectional view of a capacitor component according to an exemplary embodiment of the present inventive concept. Referring to FIGS. 1 and 2, a capacitor component 100 according to an exemplary embodiment of the present inventive concept may be configured to include a capacitor 110 and an interposer 120.

Hereinafter, elements of the capacitor component 100 will be described in detail.

The capacitor 110 may be structured to include a plurality of internal electrodes 112a and 112b, a capacitor body 111 containing a piezoelectric material, and external electrodes 113a and 113b. The capacitor 110 may be employed in various forms. By way of example, as can be seen in FIG. 2, the plurality of internal electrodes 112a and 112b may be alternately disposed in a state of being connected to the different external electrodes 113a and 113b, respectively. That is, the external electrodes may include first and second external electrodes 113a and 113b, and first and second internal electrodes 112a and 112b may be connected to the first and second external electrodes 113a and 113b, respectively. The capacitor body 111 may be disposed in at least regions between the plurality of internal electrodes 112a and 112b, and, for example, may accommodate the internal electrodes 112a and 112b therein, like the structure illustrated in FIG. 2. The capacitor body 111 may be formed of a dielectric material such as a ceramic material or the like commonly known in the art. Such a ceramic material may be a piezoelectric material in which a shape or volume thereof is varied when an electrical signal is applied thereto. As described above, acoustic noise may occur due to the piezoelectric properties of the capacitor body 111, and the exemplary embodiment may function to reduce acoustic noise using the interposer 120.

The dielectric material contained in the capacitor body 111 may include a ceramic material having a high dielectric constant. The ceramic material may include, for example, a $BaTiO_3$ (barium titanate) based ceramic powder or the like, but the present inventive concept is not limited thereto. An example of the $BaTiO_3$ based ceramic powder may include $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca (calcium) , Zr (zirconium) or the like, is partially dissolved in $BaTiO_3$, but the present inventive concept is not limited thereto.

The interposer 120 may be disposed to be coupled to the capacitor 110. In particular, the interposer 120 may be disposed to be connected to the external electrodes 113a and 113b on a lower portion of the capacitor 110. The interposer 120 may include a buffer substrate 121 and connection electrodes 122a and 122b disposed thereon, and the connection electrodes 122a and 122b may be electrically connected to the external electrodes 113a and 113b of the capacitor 110. However, shapes of the connection electrodes 122a and 122b may be variously modified. For example, unlike the structure illustrated in FIG. 2, the connection electrodes 122a and 122b may penetrate through the buffer substrate 121.

The buffer substrate 121 may contain a buffer material having no piezoelectricity or a degree of piezoelectricity lower than that of the piezoelectric material contained in the capacitor body 111, and thus, may be less deformed than the capacitor body 111 when an electrical signal is applied thereto. Therefore, the interposer 120 may serve as a buffer capable of reducing acoustic noise due to piezoelectric properties of the capacitor 110. That is, noise occurring in the capacitor 110 may be blocked or alleviated by the interposer 120 to decrease adverse effects affecting a mounting substrate or the like. Meanwhile, the buffer material capable of performing the buffer function may be a ceramic material such as $Al_2O_3$, $SiO_2$, or the like.

As an element for mechanically and electrically coupling the capacitor 110 and the interposer 120, a conductive adhesive 130 may be provided between the capacitor 110 and the interposer 120. Any material may be used as the conductive adhesive 130, as long as the material implements such a coupling function. For example, the conductive adhesive 130 may be a conductive epoxy, a eutectic metal, or the like. However, the conductive adhesive 130 is not an element necessarily required in the exemplary embodiment, and in some cases, the capacitor 110 and the interposer 120 may be directly bonded to each other.

Figure 3:
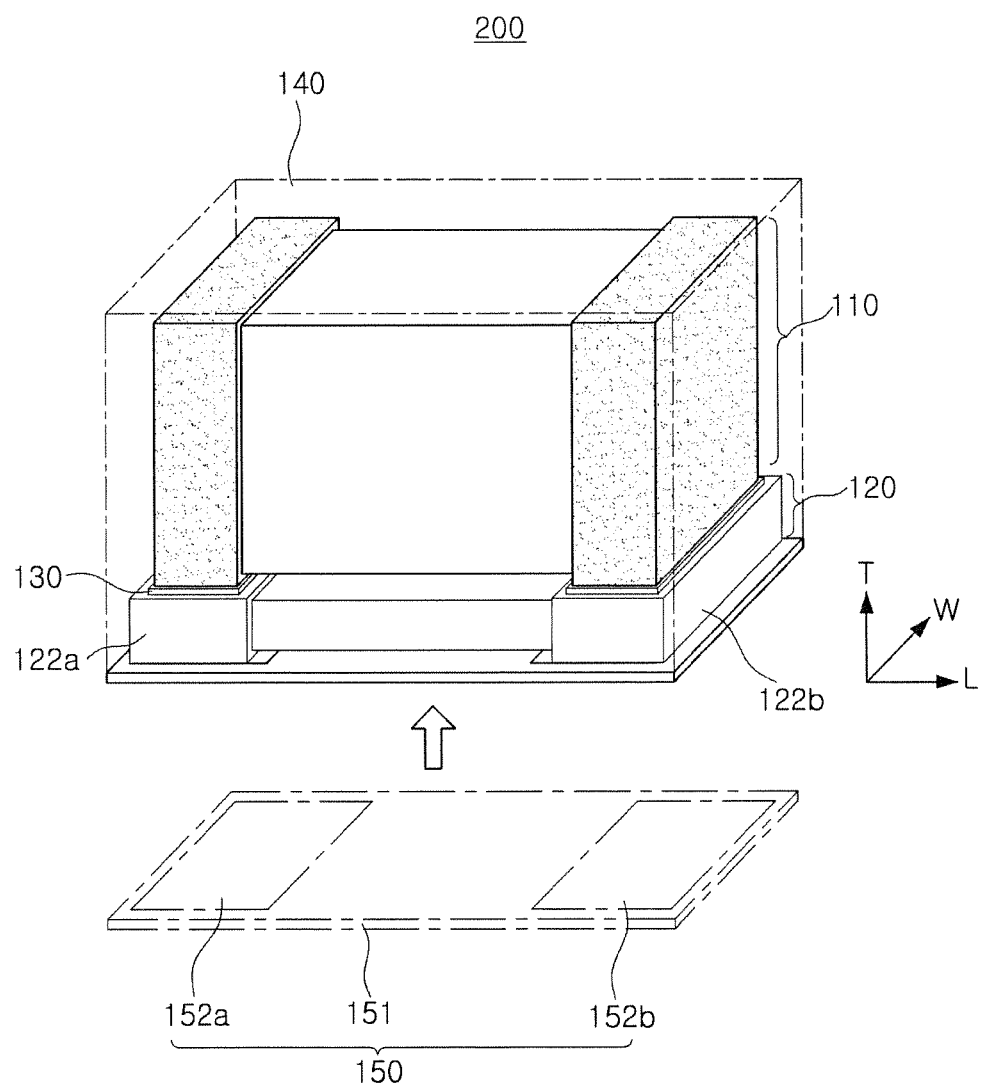
FIG. 3 is a perspective view of a capacitor component according to another exemplary embodiment of the present inventive concept.

FIG. 3 is a perspective view of a capacitor component according to another exemplary embodiment of the present inventive concept. The capacitor component according to another exemplary embodiment of the present inventive concept may further include a molding part 140 and an electrode sheet 150 to provide a structure having increased stability. The molding part 140 may encapsulate the capacitor 110, the interposer 120, and the electrode sheet 150, while outwardly exposing a portion of the electrode sheet 150, for example, a lower portion of the electrode sheet 150. The molding part 140 may function to mechanically and electrically protect the capacitor 110 and the interposer 120 in a stable manner. In consideration of the protection functions, a material forming the molding part 140 or a process of manufacturing the same may be appropriately selected. For example, the molding part 140 may comprise a resin such as epoxy or the like.

Relative to the interposer 120, the electrode sheet 150 may be disposed on the opposite side of the capacitor 110, that is, on the lower portion of the interposer 120. The electrode sheet 150 may be coupled to the interposer 120 to serve as an external terminal of the capacitor component 100. That is, when the capacitor component 100 is mounted on a circuit or a package substrate, the electrode sheet 150 may be provided as a region coupling to the substrate. To this end, the electrode sheet 150 may include a sheet portion 151 and electrode portions 152a and 152b formed thereon. Although not separately illustrated in the embodiment, the electrode portions 152a and 152b may be formed on both upper and lower surfaces of the sheet portion 151. The electrode sheet 150 is not an element necessarily required in the exemplary embodiment, and in some cases may be excluded. However, when the electrode sheet 150 is used in the capacitor component, high efficiency may be provided in designing a component or the like. That is, even when a size or shape of the capacitor 110 is different from that of a pad of a mounting substrate, the electrode sheet 150 may be formed to match with the pad of the mounting substrate, whereby the capacitor component may be further efficiently mounted. In addition, although effects of reducing vibrations are less than the case of the interposer 120, additional effects of reducing vibrations due to the electrode sheet 150 may be achieved.

Figure 4:
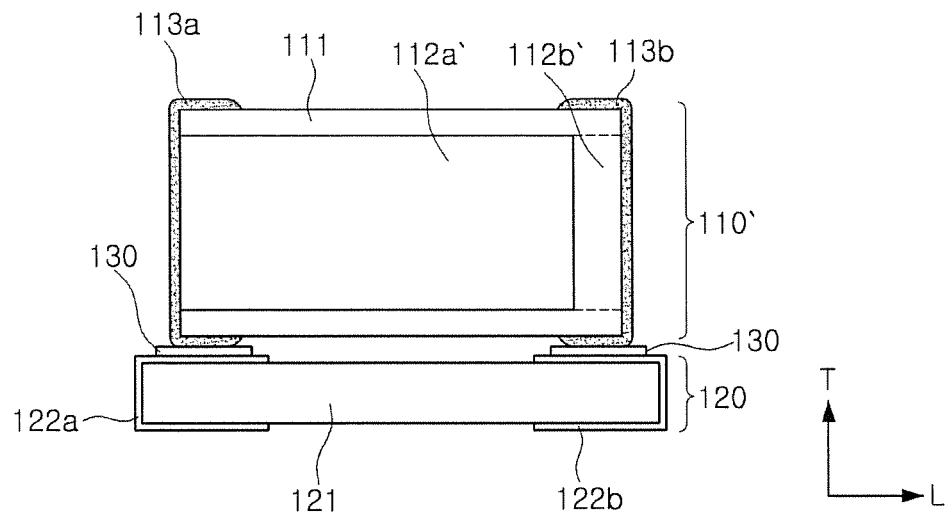
FIGS. 4 and 5 are cross-sectional views of capacitor components according to examples modified from the embodiment shown in FIG. 2.
Figure 5:
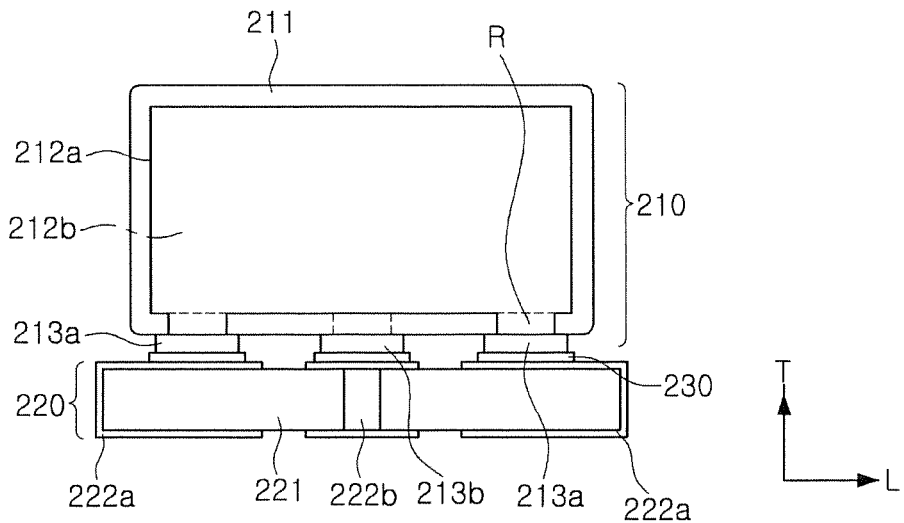
Figure 6:
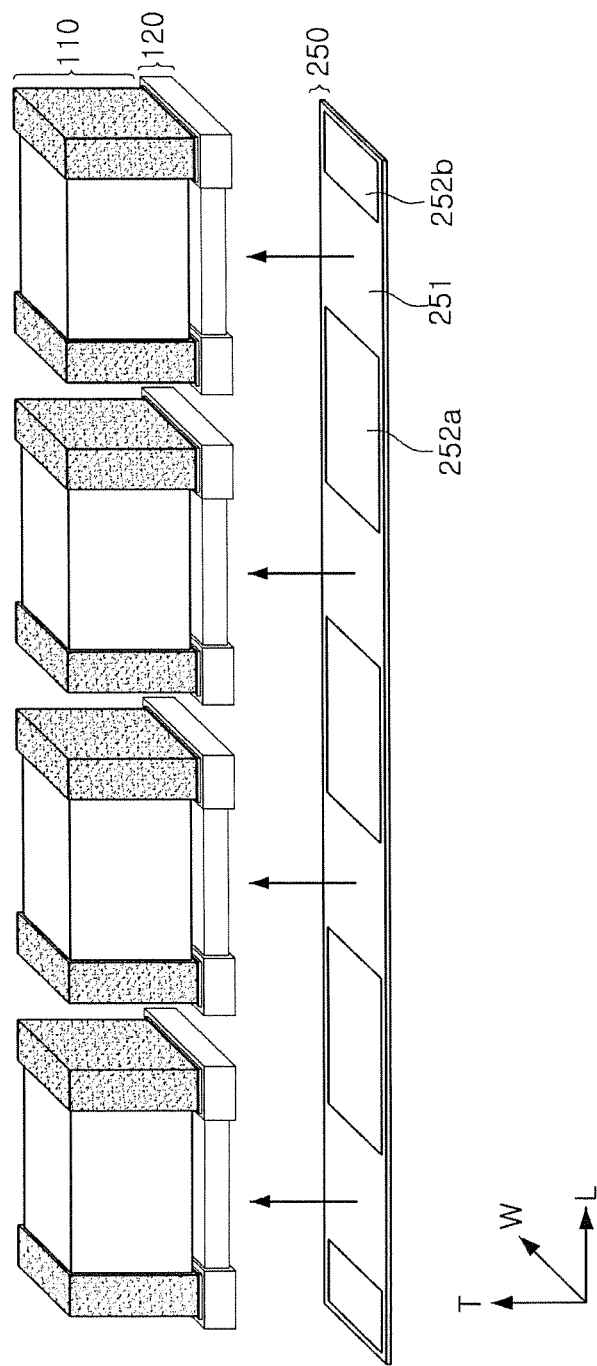
FIGS. 6 through 9 are perspective views of capacitor components according to other modified examples.
Figure 7:
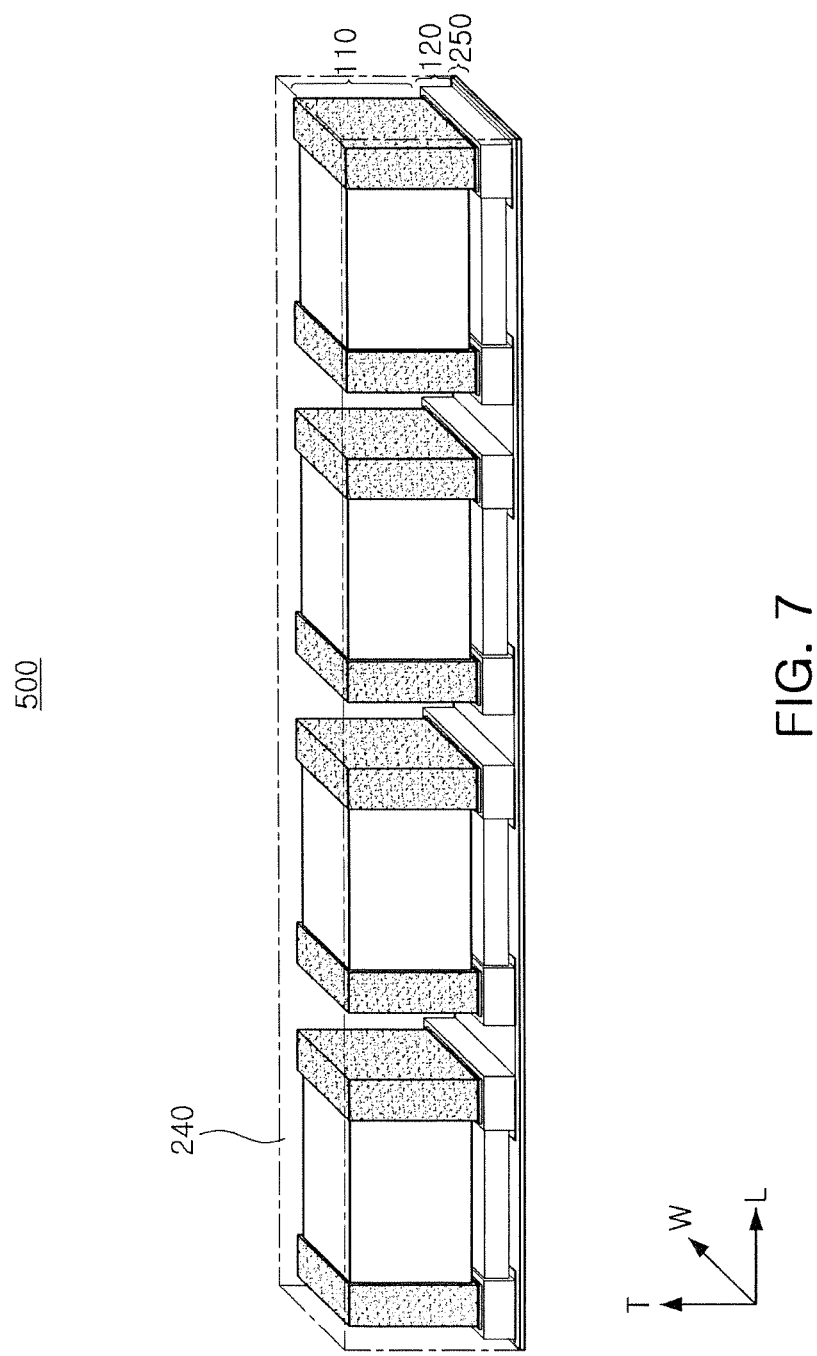

FIGS. 4 and 5 are cross-sectional views of capacitor components according to modified examples of the embodiment illustrated in FIG. 2. The embodiments shown in FIGS. 4 and 5 are different from the foregoing embodiments in terms of forms thereof. In comparison with the embodiment of FIGS. 1 and 2, a capacitor component 300 according to the embodiment of FIG. 4 has differences in terms of the orientation in which internal electrodes 112a' and 112b' are disposed. Specifically, a capacitor 110' may include internal electrodes disposed in a vertical direction. That is, unlike the embodiment of FIG. 2 in which the plurality of internal electrodes 112a and 112b are disposed in parallel with respect to the interposer 120, the plurality of internal electrodes 112a' and 112b' may be disposed orthogonally with respect to the interposer 120. The vertical mounting manner may also be applied to a three-terminal structure as in FIG. 5. Such a three-terminal vertical mounting manner may be suitable for reducing equivalent series resistance or inductance of the capacitor, by decreasing a current path and the like. In the case of a capacitor component 400 according to the embodiment of FIG. 5, a capacitor 210 may include a capacitor body 211, a plurality of internal electrodes 212a and 212b, and a plurality of external electrodes 213a and 213b. The plurality of internal electrodes 212a and 212b may be disposed orthogonally with respect to an interposer 220. As can be seen in FIG. 5, the external electrodes may include two first external electrodes 213a and a single second external electrode 213b. The plurality of internal electrodes may be configured to include first internal electrodes 212a connected to the two first external electrodes 213a and second internal electrodes 212b connected to the second external electrode 213b. The first and second internal electrodes 212a and 212b may respectively include lead portions R to be connected to the first and second external electrodes 213a and 213b.

The interposer 220, which functions to reduce vibrations, may also include three connection electrodes so as to be connected to the capacitor 210 in a three-terminal vertical mounting manner. Specifically, two first connection electrodes 222a may be connected to the first external electrodes 213a, and a single second connection electrode 222b may be connected to the second external electrode 213b. A conductive adhesive 230 formed as described above may be disposed between the connection electrodes and the external electrodes. FIG. 5 illustrates a case in which the first connection electrodes 222a are disposed on a surface of a buffer substrate 221, but the first connection electrodes 222a may also penetrate through the buffer substrate 221 as described above. FIG. 5 illustrates a case in which the second connection electrode 222b penetrates through the buffer substrate 221, but it may be disposed on the surface of the buffer substrate 221.

Although FIGS. 4 and 5 do not illustrate elements described in the foregoing embodiments, that is, the molding part and the electrode sheet, the molding part and the electrode sheet may also be applied to the present exemplary embodiment.

FIGS. 6 through 9 are perspective views of capacitor components according to other modified examples. In FIGS. 6 through 9, a single capacitor component may include a plurality of capacitors. First, a capacitor component 500 having a form illustrated in FIGS. 6 and 7 may include a plurality of capacitors 110 and interposers 120 coupled to the capacitors, and a single electrode sheet 250 connected to the plurality of capacitors and the plurality of interposers. In addition, the capacitor component 500 may include a molding part 240 entirely encapsulating the capacitors 110, the interposers 120, and the electrode sheet 250. In this case, although the capacitor 110 and the interposer 120 are illustrated as those illustrated in FIGS. 1 and 2, other structures as described above may also be used. As in the exemplary embodiment, the plurality of capacitors 110 and interposers 120 may be used and may be disposed in an array form in such a manner that they form at least one row or column, whereby a high capacity capacitor component may be efficiently obtained. The plurality of capacitors 110 and interposers 120 may be arranged to form a row in a width direction of the capacitor component or in a length direction of the capacitor component.

In the exemplary embodiment, the capacitor component 500 may include a single electrode sheet 250. Relative to the plurality of interposers 120, the electrode sheet 250 may be disposed on the opposite side of the plurality of capacitors 110 and may be coupled to the plurality of interposers 120. In addition, the electrode sheet 250 may include a sheet portion 251 and electrode portions 252a and 252b that are integrally formed. Due to such a structure of the electrode sheet 250, the plurality of capacitors 110 may be connected to each other in series. However, depending on embodiments, the electrode sheet 250 may include a plurality of separate regions, rather than having an integral structure.

Figure 8:
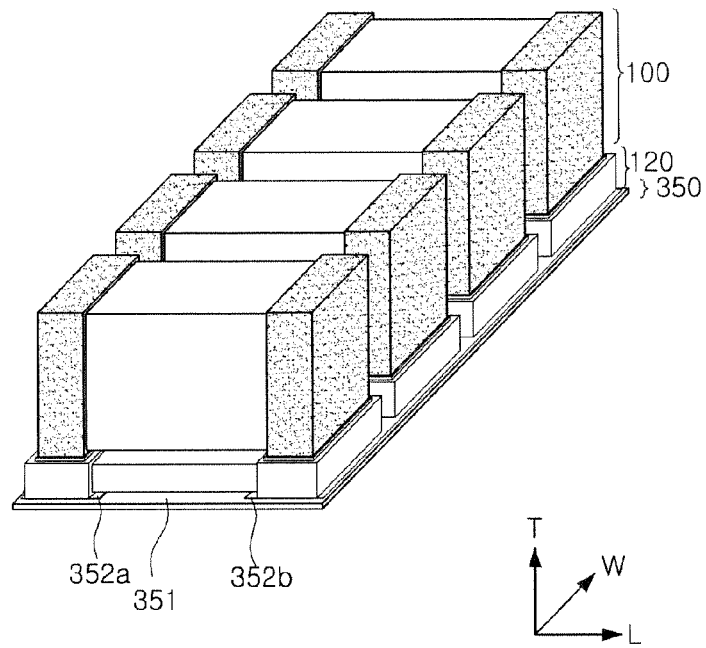
Figure 9:
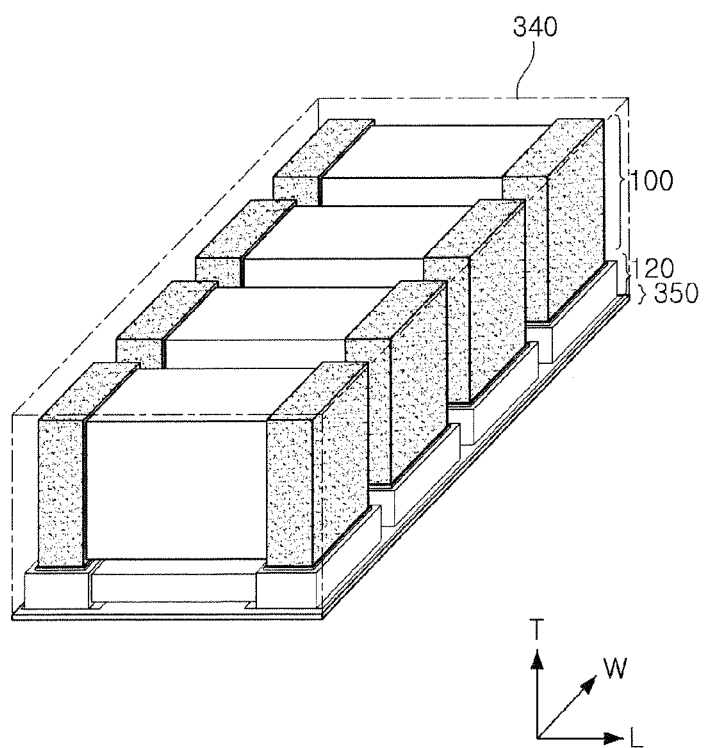

Then, similar to the capacitor component 500, a capacitor component 600 having a form illustrated in FIGS. 8 and 9 may also include the plurality of capacitors 110 and interposers 120 coupled to the capacitors, and a single electrode sheet 350 connected to the plurality of capacitors and the plurality of interposers.

In addition, the capacitor component 600 may include a molding part 340 entirely encapsulating the capacitors 110, the interposers 120, and the electrode sheet 350. In an exemplary embodiment, the capacitor component 600 may include a single electrode sheet 350. Based on the plurality of interposers 120, the electrode sheet 350 may be disposed in the opposite side of the plurality of capacitors 110 and may be coupled to the plurality of interposers 120. In addition, the electrode sheet 350 may include a sheet portion 351 and electrode portions 352a and 352b that are integrally formed. However, unlike the foregoing embodiment, the plurality of capacitors 110 may be connected to each other in parallel. However, depending on embodiments, the electrode sheet 350 may include a plurality of separate regions, rather than having an integral structure.

As set forth above, according to exemplary embodiments of the present inventive concept, acoustic noise of a capacitor component may be reduced by using an interposer capable of decreasing or preventing displacement of a capacitor.

While exemplary embodiments have been shown and described above, it will be apparent to those skilled in the art that modifications and variations could be made without departing from the scope of the invention as defined by the appended claims.

What is claimed is:

1. A capacitor component comprising:
    a capacitor including a plurality of internal electrodes, a capacitor body containing a piezoelectric material disposed at least in regions between the plurality of internal electrodes, and external electrodes connected to the plurality of internal electrodes;
    an interposer disposed to be coupled to the capacitor and including
        a buffer substrate containing a buffer material having a degree of piezoelectricity lower than that of the piezoelectric material,
        connection electrodes electrically connected to the external electrodes, and
    an electrode sheet disposed on an opposite side of the interposer from the capacitor and coupled to the interposer, and including a sheet portion and electrode portions formed on upper and lower surfaces of the sheet portion, and
    a molding part having substantially same width as the electrode sheet, encapsulating the capacitor, the interposer, and the electrode sheet while outwardly exposing a portion of the electrode sheet.

2. The capacitor component of claim 1, wherein the molding part encapsulating the capacitor and the interposer while outwardly exposing a portion of the interposer.

3. The capacitor component of claim 1, further comprising: a conductive adhesive disposed between the capacitor and the interposer.

4. The capacitor component of claim 1, wherein the plurality of internal electrodes are disposed orthogonally with respect to the interposer.

5. The capacitor component of claim 1, wherein the plurality of internal electrodes are disposed in parallel with respect to the interposer.

6. The capacitor component of claim 1, wherein the external electrodes include first and second external electrodes, and the plurality of internal electrodes include first and second internal electrodes connected to the first and second external electrodes, respectively.

7. The capacitor component of claim 1, wherein the external electrodes include two first external electrodes and a single second external electrode, and the plurality of internal electrodes include first internal electrodes connected to the two first external electrodes and second internal electrodes connected to the second external electrode.

8. The capacitor component of claim 7, wherein the first and second internal electrodes respectively include lead portions to be connected to the first and second external electrodes.

9. The capacitor component of claim 1, wherein each of the capacitor and the interposer coupled to the capacitor is provided in plural, and
the plurality of capacitors and interposers are arranged to form a row in a width direction of the capacitor component or in a length direction of the capacitor component.

10. The capacitor component of claim 9, further comprising: a molding part entirely encapsulating the plurality of capacitors and interposers.

11. The capacitor component of claim 9, further comprising: an electrode sheet disposed on an opposite side of the plurality of interposers from the plurality of capacitors, integrally formed and coupled to the plurality of interposers, and including a sheet portion and an electrode portion disposed on the sheet portion.

12. The capacitor component of claim 1, wherein the external electrodes comprise at least two first external electrodes and a second external electrode, and the connection electrodes comprise at least two first connection electrodes and a second connection electrode, the first external electrodes being connected to the first connection electrodes and the second external electrode being connected to the second connection electrode.

13. The capacitor component of claim 1, wherein at least one of the connection electrodes penetrates the interposer.

14. A capacitor component comprising:
a capacitor comprising a piezoelectric material and external electrodes;
an interposer comprising
a buffer substrate having a lower degree of piezoelectricity than the piezoelectric material and
connection electrodes, the connection electrodes being coupled to the external electrodes on a first surface of the interposer;
an electrode sheet comprising electrode portions coupled to the connection electrodes on a second surface of the interposer opposite to the first surface of the interposer; and
a molding portion having substantially same width as the electrode sheet and encapsulating the capacitor, the interposer and the electrode sheet while outwardly exposing portions of a surface of the electrode sheet,
wherein the electrode sheet is formed within an edge of the molding portion.

15. A capacitor component comprising:
a plurality of capacitors each comprising a piezoelectric material and external electrodes;
a plurality of interposers each comprising
a buffer substrate having a lower degree of piezoelectricity than the piezoelectric material and
connection electrodes, each interposer disposed to be coupled to one among the plurality of capacitors,
wherein the connection electrodes of each interposer are coupled to the external electrodes of the coupled capacitor on a first surface of the interposer;
an electrode sheet comprising electrode portions coupled to the connection electrodes on a second surface of each of the plurality of interposers opposite to the first surface of each of the plurality of interposers; and
a molding portion encapsulating the plurality of capacitors, the plurality of interposers and the electrode sheet while outwardly exposing portions of a surface of the electrode sheet.

16. The capacitor component of claim 15, wherein the plurality of capacitors and interposers are arranged to form a row in a width direction of the capacitor component.

17. The capacitor component of claim 15, wherein the plurality of capacitors and interposers are arranged to form a row in a length direction of the capacitor component.

* * * * *